US005594802A

United States Patent [19]

Berghoff et al.

[11] Patent Number: 5,594,802

[45] Date of Patent: Jan. 14, 1997

[54] SOUND SYSTEM FOR USE WITH GAS FIREPLACES AND SIMULATING BURNING WOOD

[76] Inventors: Jan S. Berghoff, 9514 Bennett Pl., Eden Praire, Minn. 55347; Jeff Hendrick, #338 5220 Lincoln Dr., Edina, Minn. 55436

[21] Appl. No.: 279,540

[22] Filed: Jul. 25, 1994

[51] Int. Cl.[6] .............................. H03G 3/00; F23Q 2/32; F24B 1/18

[52] U.S. Cl. .............................. 381/61; 362/86; 431/125; 126/500; 126/512

[58] Field of Search .............................. 381/61; 369/171; 315/210, 200, 151, 159, 158, 76, 185, 307, 309; 362/92, 276, 802, 86; 126/500, 512; 431/125, 253

[56] References Cited

U.S. PATENT DOCUMENTS 4,253,045 2/1981 Weber .............................. 315/210
4,965,707 10/1990 Butterfield .............................. 362/96
4,983,119 1/1991 Lin .............................. 431/253
5,195,820 3/1993 Rehberg .............................. 362/523

*Primary Examiner*—Edward L. Coles, Sr.
*Assistant Examiner*—Jerome Grant, II
*Attorney, Agent, or Firm*—Joel D. Skinner, Jr.

[57] ABSTRACT

A simulated wood burning sound system, including an electronic circuit that provides the "crackle" sound of a combustible wood fire. The system includes a programmed electronic sound chip that stores a recorded memory of wood burning sound. A volume control potentiometer adjusts the audio volume of the sound being transmitted through a speaker and is adjustable to simulate a range of sound effects from a quite fire to a roaring fire. A temperature sensitive sensor for detecting heat or a light sensitive sensor controls automatic startup and shutdown. In addition, a power switch has a permanent "on" position for testing the unit and for applications, such as a simulated fire, where a sensor is not applicable. A plastic housing protects the circuitry and provides a mounting base.

1 Claim, 3 Drawing Sheets

SOUND SYSTEM FOR USE WITH GAS FIREPLACES AND SIMULATING BURNING WOOD

BACKGROUND OF THE INVENTION

1. Field of the Invention

The present invention relates to simulated fireplaces and particularly to gas fireplaces. The invention provides a sound generation system for use with gas fireplaces, which produces sound effects of burning wood logs.

2. Background Information

Fireplaces have existed for several centuries. The original purpose of a fireplace was to provide heat for a living space. In modern times, in addition to heat, fireplaces are valued for the soothing ambiance they provide, derived from their appearance and the "crackle" sound generated by burning wood. In the past five years, due to added cleanliness, improved heating efficiency and environmental restrictions on air pollution, gas fireplaces have grown in popularity. Today, 90% of all fireplaces sold are gas, not wood burning. The term gas fireplace as used herein is intended to encompass both natural gas as well as propane fueled units.

One of the major complaints from owners of gas fireplaces is the lack of ambiance due to the absence of the "crackle" sound of burning wood. The burning of natural gas or propane is almost completely silent. Insofar as is known, no apparatus has been used or proposed for this problem. There is a need for a device, useable with a gas fireplace, which produces the sound of a wood burning fireplace.

It is an object of the present invention to provide a device, useable with a gas fireplace, which produces the sound of a wood burning fireplace. It is a further object of this invention to provide a device which is inexpensive and simple to produce, install and use, which is reliable, and which is safe.

SUMMARY OF THE INVENTION

This invention provides a simulated wood burning sound system, including an electronic circuit that provides the "crackle" sound of a combustible wood fire. The apparatus provided by this invention simulates the sound of a combustible wood fire. Uses of the device include, but are not limited to, enhancing the sound of non-combustible fires such as gas fireplaces, simulated fires, and fire burning sound effects for audio purposes where visual media is not needed such as theater, TV or video production.

The circuit features a programmed electronic sound chip that stores a recorded memory of crackling wood burning sound. A volume control potentiometer adjusts the audio volume of the sound being transmitted through a speaker and is adjustable to simulate a range of sound effects from a quiet fire to a roaring fire. A temperature sensitive sensor for detecting heat or a light sensitive sensor for detecting direct light (existence of real or simulated flame) controls the auto mode feature of the device. The purpose of the sensor is to automatically initiate a "crackle" sound upon fire start-up and to silence the "crackle" sound when the fire is absent. In addition to the auto mode, the power switch has a permanent "on" (or test) position for testing the unit and for applications, such as a simulated fire, where a sensor is not applicable. A power LED indicator light confirms that the unit is operating properly. A plastic housing serves to protect the circuitry and to provide mounting. The unit may be placed on any flat surface or mounted to a non-horizontal surface using double faced tape, for example.

The unit has outer dimensions of approximately 3×4×¾ inches so that it can easily be tucked beneath a gas fireplace (within the control compartment), or it can be easily concealed near the fireplace and thus provide the same effect. The unit is powered via a 120 volt receptacle typically located within the control compartment of standard gas fireplaces.

DETAILED DESCRIPTION OF THE PREFERRED EMBODIMENT

1. Sound System Unit

Figure 1:
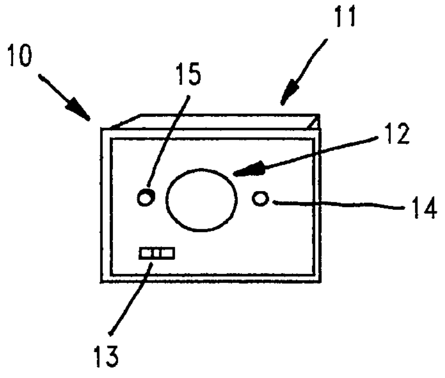
FIG. 1 is the front view of the simulated wood burning sound system for use with gas fireplaces of the present invention, including a volume control knob, power LED indicator light, three position Test-Off-Auto switch and speaker outlet area.
Figure 2:
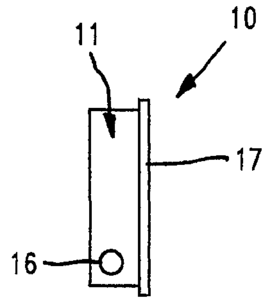
FIG. 2 is the side view of the sound system, including an input jack for the power adapter cord.
Figure 4:
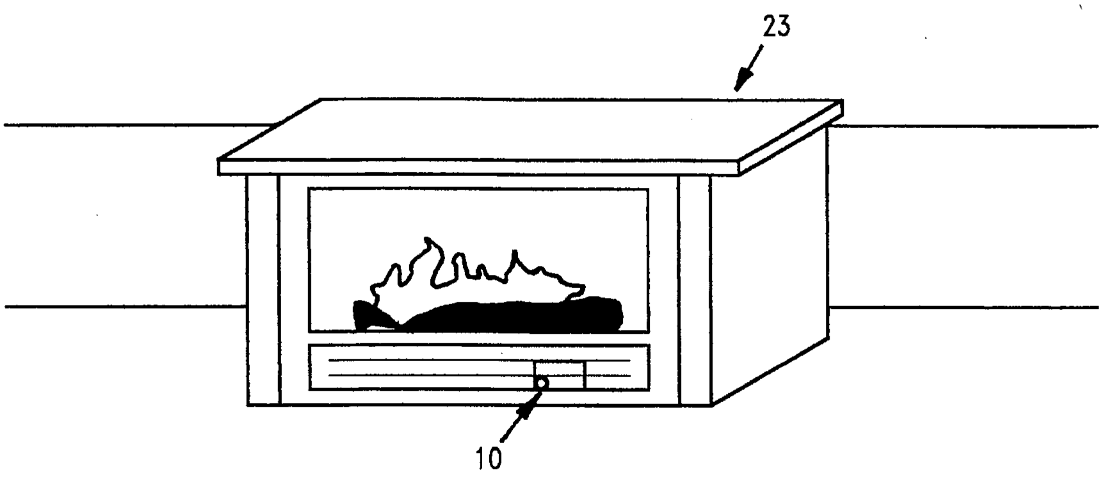
FIG. 4 is a front view of a typical gas fireplace showing a common positioning of the unit thereon.

The sound system 10 is shown in FIGS. 1 and 2. The system unit 10 is contained in a housing 11. A speaker 12 is exposed preferably on the front of the unit 10. A switch 13, power indicator 14 and volume control 15 are also disposed on the front of the unit 10. A power jack 16 is disposed on the side of the unit 10. The plastic housing 11 provides physical protection of an internally located circuit board 34 in addition to several different unit mounting options. Depending on physical constraints, the unit 10 can be placed on edge or placed on its back. A typical positioning of the unit 10 with respect to a gas or other non-wood burning fireplace 23 is shown in FIG. 4. The housing 11 also has an adhesive front overlay or bezel 17 which serves the provides aesthetic and instructive labeling for the unit's features (such as volume control and switch operation), as well as protecting the integrity of the speaker 12.

Figure 3:
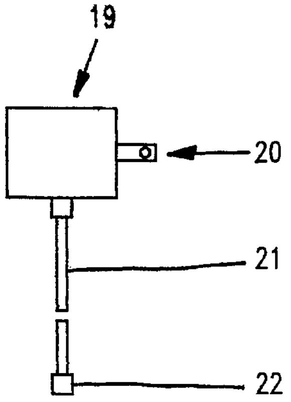
FIG. 3 is a view of a 120 volt adapter used with the system.

Referring also to FIG. 3, the system further comprises a power adapter 11, including a plug housing 20, a cable or wire 21 and a modular plug 22, which plug into a standard 120 volt receptacle and transforms standard 120 volt AC power down to 12 volts DC power. The 12 volts DC power is received by the device 10 circuit through the 12 volt DC secondary wire 21 of the adapter 19. This 12 volt secondary wire connects to the unit through the DC power jack 16 located on the side of the housing 11. As the 12 volt power is received it is regulated and decreased to 5 volts DC by a positive voltage regulator. This 5 volt regulated voltage is used to power the remaining circuitry within the device 10. Alternatively, the unit can be modified to accept a 9 volt battery as a power source. This is beneficial in applications where 120 volt power is not available. For the purpose of diagnostics the unit 10 features the LED power indicator light 14 for detecting power and proper operation.

Referring again to FIGS. 1, 5, and 6 the unit 10 has a "test-off-auto" double pole triple throw switch 13. When set on the "auto" position, the sound transmission signals are activated by the temperature measurement circuitry 31 or a light detection sensor 31 can be used where temperature sensing is not applicable. The temperature measurement circuit uses a 10 Kohm PTC thermistor sensor 31 and limiting resistor 32 to sense an activation temperature of 87 degrees F plus or minus two degrees. Therefore, upon turning the gas fireplace "on", the heat given off by the fire will automatically activate the unit 10 and the user will begin hearing the sound of burning/crackling wood. When the gas fireplace 23 is then turned "off", the unit will automatically shut off as the temperature cools.

The unit temperature detection sensor circuitry or light detector sensor can be by-passed by setting the "test-off-auto" switch 13 to the "test" position. This feature allows the user to activate the device without sensing temperature or light. This is beneficial for simulated audio fires (radio, TV, video) and fireplaces where internal mounting is not applicable.

Whether activated by the temperature sensor 31, an optical light sensor or "test" position switch 13, the sound transmission signal is amplified by the audio output speaker 12. The speaker 12 transmits the crackle sound through holes in the front face 17 of the housing 11. A variable resistance potentiometer is preferably used as the volume control 15 allows the user to increase or decrease the audio output volume. This provides the option to alter the ambiance or raise the volume above that of a fireplace blower.

2. Sound Recording, Processing and Playback

Figure 5:
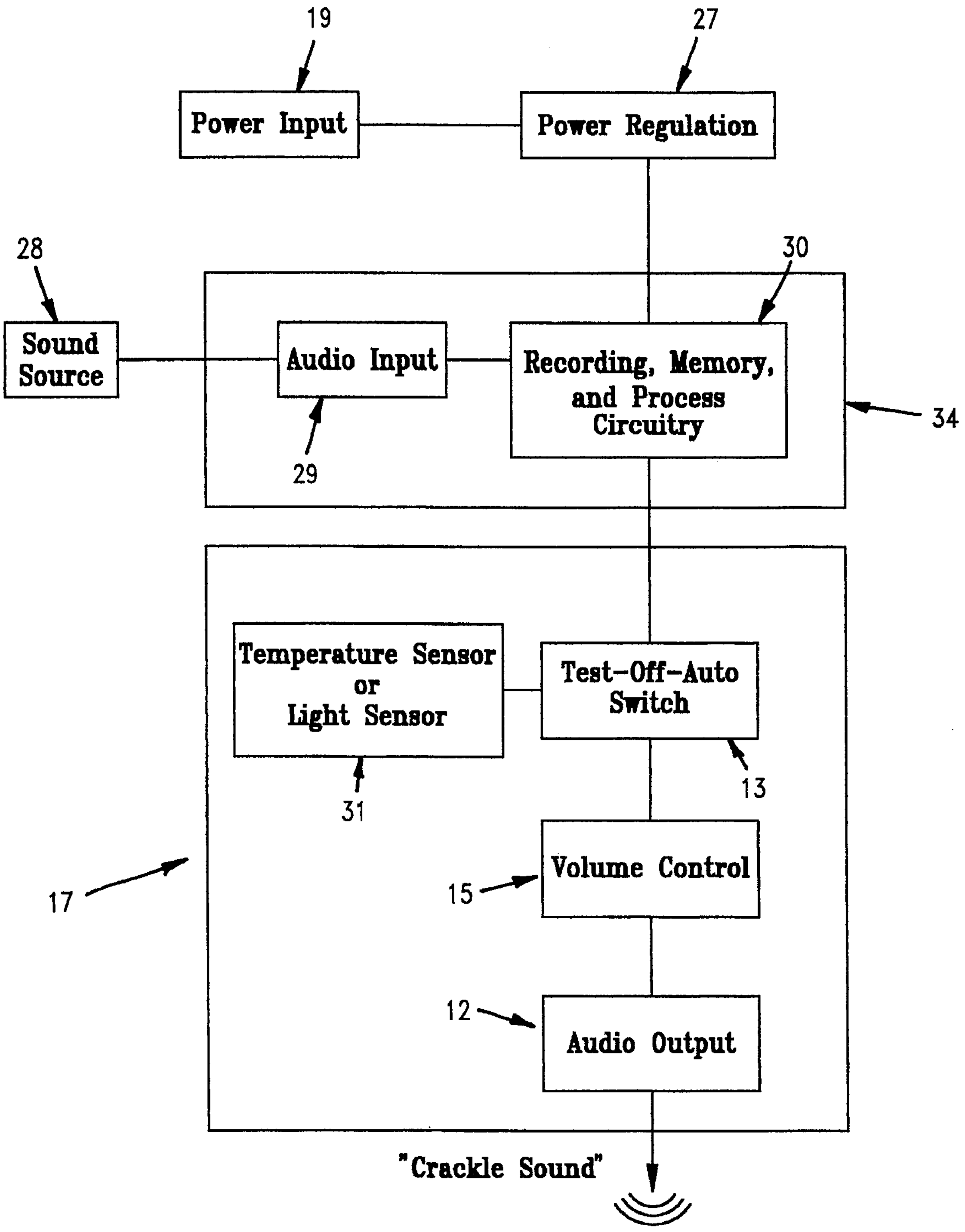
FIG. 5 is a flow diagram illustrating the operation of the unit.

Referring to FIG. 5, a sound source 28 consisting of a mixture of sounds, is recorded onto a voice chip or integrated circuit using an external microphone 29 which converts the sound to a proportional voltage signal that is received into memory by the voice chip 30. The sound source is preferably burning fireplace logs. Alternatively, fabricated fire sounds such as the crumpling of plastic materials may be used. Once the voice chip 30 receives the sound activated voltage, its functions include storing the signal, audio reproduction, zero power message, EEPROM storage, automatic power down and signal amplification to the speaker 12. The chip 30 repeatedly plays the recording, which is preferably 10 seconds in duration. Playback is initiated in one of two ways; first by placing the control switch in a "TEST" mode, or by a signal from the temperature sensor, when the switch is placed in an "AUTO" mode. In this later mode, a comparator circuit takes an input from the temperature sensor and initiates playback when it surpasses a predetermined level. Power is provided to the unit 10 only in the "TEST" or "AUTO" modes.

3. Circuit Board Components and Layout

Figure 6:
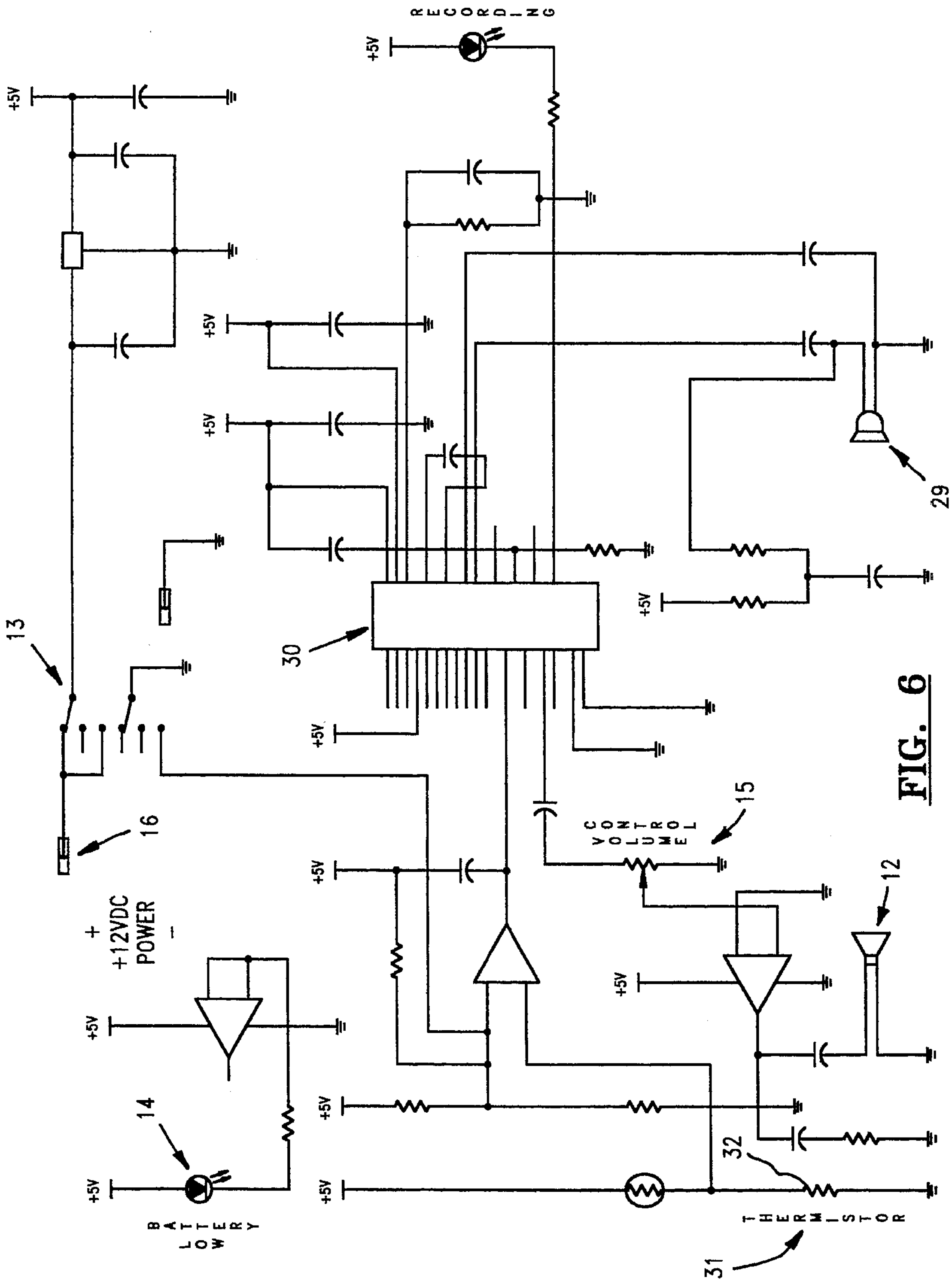
FIG. 6 is the schematic for the circuit board.

Referring also to FIG. 6, the circuit board assembly comprises the following circuit sections: Power Input (PI), Power Regulation (PR), Sound Recording and Processing (SRP), and Sound Activation, Transmission, and Amplification (SATA).

The power input section basically functions to receive the input voltage and step it down to 12 volts DC. The power input section circuitry includes a transformer and preferably resides in the plug-in power adapter shown in FIG. 3.

The power regulation section receives the 12 V DC from the input section and reduces it to 5 V DC.

The sound recording and processing section functions to receive and transform input audio signals to electrical signals which are then stored and transmitted at predetermined times. The important components of the sound recording and processing section include the microphone 29, an audio recording and playback IC 30, amplifiers and the speaker 12. The IC 30 is preferably an ISD1110.

The sound activation, transmission and processing section initiates sound transmission based on the position of the control switch 13 or a digital signal from an Op amp which compares the temperature sensor 31 voltage to a reference voltage level.

As many changes are possible to the embodiments of this invention utilizing the teachings thereof, the descriptions above and the accompanying drawings should be interpreted in the illustrative and not the limited sense.

The invention claimed is:

1. An electronic burning wood sound generator for use with a gas flame fireplace and simulating the sound of a burning wood fire, comprising:

(a) an integrated circuit containing means to record and repeatedly playback a substantially 10 second sound pattern substantially similar to that produced by burning wood; and (b) a speaker connected to said integrated circuit;

(c) means to convert 120 volt AC power to substantially 5 volt DC power, said means being connected to said integrated circuit and to said speaker;

(d) a substantially 10 Kohm PTC thermistor temperature sensor connected to said integrated circuit for detecting the presence of heat from the gas flame of the fireplace, said sensor signaling said integrated circuit to begin transmitting sounds, via said speaker, simulating burning wood, said sensor further signaling said integrated circuit to terminate transmitting sounds upon detecting the absence of heat due to gas flame stoppage;

(e) a double pole triple throw control switch connected to said power source and said integrated circuit;

(f) a volume control variable resistance potentiometer connected to said integrated circuit; and (g) a microphone, connected to said integrated circuit, to receive sound signals representative of a burning wood fire.

* * * * *